United States Patent [19]

Kinoshita et al.

[11] Patent Number: 4,612,454

[45] Date of Patent: Sep. 16, 1986

[54] METHOD FOR CONTROLLING SIGNAL INTEGRATION TIME OF A SIGNAL INTEGRATION TYPE IMAGE SENSING DEVICE

[75] Inventors: Takao Kinoshita, Tokyo; Tokuichi Tsunekawa; Yuichi Sato, both of Yokohama, all of Japan

[73] Assignee: Canon Kabushiki Kaisha, Tokyo, Japan

[21] Appl. No.: 613,768

[22] Filed: May 24, 1984

Related U.S. Application Data

[63] Continuation of Ser. No. 324,435, Nov. 24, 1981, abandoned.

[30] Foreign Application Priority Data

Dec. 2, 1980 [JP] Japan ............................. 55-170626

[51] Int. Cl.[4] ...................... H03K 3/42; H01L 29/78; H01L 27/14; H01L 31/00
[52] U.S. Cl. .................................... 307/311; 357/24; 357/30
[58] Field of Search ............. 357/24 LR, 30; 307/311; 377/57-63

[56] References Cited

U.S. PATENT DOCUMENTS 4,321,486 3/1982 Boler et al. .................... 357/24 LR

FOREIGN PATENT DOCUMENTS 55-110477 8/1980 Japan .

Primary Examiner—Gene M. Munson
Attorney, Agent, or Firm—Fitzpatrick, Cella Harper & Scinto

[57] ABSTRACT

Disclosed is a method for controlling a signal integration time of signal integration type image sensing device having a plurality of signal integration type radiation-sensitive elements. An integrated value of the signal from at least one of the radiation-sensitive elements is monitored without contact. When the integrated value of the signal from this element reaches a predetermined value after initiation of the signal integration, a control signal is generated to start readout of the signals from all the elements up to this point.

5 Claims, 15 Drawing Figures

METHOD FOR CONTROLLING SIGNAL INTEGRATION TIME OF A SIGNAL INTEGRATION TYPE IMAGE SENSING DEVICE

This application is a continuation of application Ser No. 324,435, filed Nov. 24, 1981, and now abandoned.

BACKGROUND OF THE INVENTION

1. Field of the Invention

The present invention relates to a method for controlling the signal integration time of a signal integration type image sensing device having a plurality of signal integration type radiation-sensitive elements.

2. Description of the Prior Art

In a signal integration type image sensing device such as a CCD (Charge Coupled Device) image sensor, a BBD (Bucket Brigade Device) image sensor, or an MOS-image sensor (Self-Scan Photodiode Array), it is necessary to automatically control the signal integration time, that is, the time for integrating the electric signals (charge) which are generated in correspondence to the intensity of incident light, in order to enlarge the dynamic range of the radiation-electric (charge) conversion.

As a method for controlling the signal integration time of a signal integration type image sensing device of this type, there is known a conventional method in which it is discriminated if the output level of the image sensing device during readout is suitable, too high or too low. If the output level of the image sensing device is too high, the signal integration time for the subsequent integration operations is controlled so that the signal integration times may become shorter in a stepped manner. On the other hand, if the output level from the image sensing device is too low, the signal integration times for the subsequent signal integration operations are so controlled that the signal integration times may be lengthened in a stepped manner.

However, with such a conventional method, control must be performed so that a plurality of mutually different discrete signal integration times are preset and a suitable one is selected in each signal integration operation. Therefore, the configuration of a control circuit for such control becomes complex. Furthermore, since the change in time is made in a stepped manner, the control is unable to follow abrupt changes in the intensity of incident radiation. When the intensity of incident radiation periodically changes (e.g., due to effects of artificial illumination), the output level fluctuates upon every signal integration operation even with the same signal integration time, if the scanning device of the image sensing device is not well synchronized with the change in the intensity of incident radiation. This method is also poor in reliability since the control involved in this method is not the so-called "real time" control.

In consideration of this, the assignee of the present application proposed, in Japanese Patent Application No. 54-17425 (Japanese Laid-Open Patent Application No. 55-110477), a method for controlling the signal integration time of a signal integration type image sensing device wherein a timing for initiating readout of integration signals from all radiation-sensitive elements up to this point is determined by detecting if the integrated value of the signal from at least one of these radiation-sensitive elements reaches a predetermined value after initiation of signal integration. This method is novel and is advantageous in that control of the signal integration time may be performed in "real time" and in a nonstepped manner. Therefore, this method solved various problems with the conventional method.

In the embodiment disclosed in the specification and the drawings of this Japanese Patent Application No. 54-17425, in order to detect if the integrated value of the signal from at least one of the radiation-sensitive elements reaches a predetermined value after initiation of signal integration, an overflow of a signal generated from the radiation-sensitive element through an overflow drain gate is detected, the overflow drain gate being incorporated for the radiation-sensitive element for the purpose of preventing blooming. However, with this method, the overflowed signal generated at the radiation-sensitive element is clipped, and a video signal (image scanning signal) from the image sensing device is adversely affected.

SUMMARY OF THE INVENTION

The present invention has been made in consideration of this and has for its object to provide an improvement over a conventional method as exemplified in the specification and drawings of Japanese Patent Application No. 54-17425.

It is another object of the present invention to provide an improved method for controlling a signal integration time of a signal integration type image sensor, which allows control of the signal integration time in "real time" and in a nonstepped manner and which does not adversely affect a video signal from an image sensing device.

In order to achieve these objects, there is provided according to an aspect of the present invention a method for controlling a signal integration time of a signal integration type image sensing device having a plurality of signal integration type radiation-sensitive elements, comprising monitoring an integrated value of signals of at least one of the radiation-sensitive elements without clipping or the like of the signals, and generating, when the integrated value of the radiation-sensitive element reaches a predetermined value, a control signal for initiating readout of the integrated values of the signals from all the radiation-sensitive elements at this point.

It is still another object of the present invention to provide a structure of a signal integration type image sensing device suitable for this method.

In order to achieve this object, there is provided according to another aspect of the present invention a signal integration type image sensing device comprising a means for monitoring an integrated value of at least one of the radiation-sensitive elements without clipping or the like of the signals, the monitoring means being arranged at part of the radiation-sensitive element or in the vicinity thereof.

The monitoring means may specifically comprise a floating gate. With a floating gate, the charge (signal) may be detected without clipping or the like, hence, adverse effects in a well known manner, and the floating gate is quite suitable for the purpose of the present invention.

The other objects and features of the present invention will become apparent from the following description when taken in conjunction with the accompanying drawings.

BRIEF DESCRIPTION OF THE DRAWINGS

The preferred embodiments of the present invention will now be described with reference to the accompanying drawings, in which.

DETAILED DESCRIPTION OF THE PREFERRED EMBODIMENTS

Before describing the preferred embodiments of the present invention, the conventional control method of the signal integration time of a signal integration type image sensing device will first be described.

Figure 1:
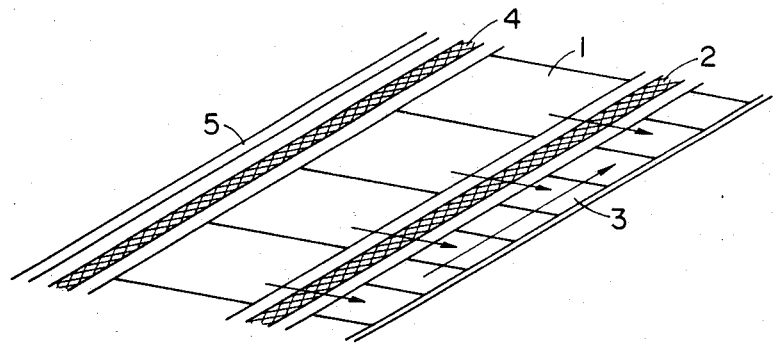
FIG. 1 is a schematic perspective view of a conventional signal integration type image sensing device.

Referring to FIG. 1, a one-dimensional CCD sensor with a linear array of a number of photoelectric transducer elements is shown as an example of a signal integration type image sensing device. A photoelectric transducer portion (radiation-electric conversion portion) 1 has N separate sensitive elements (radiation-sensitive elements). A shift gate 2 shifts charges generated by the photoelectric transducer portion 1 to a transfer portion 3 comprising a CCD. In response to drive pulses from a drive pulse generator (not shown), the transfer portion 3 transfers the charges received through the shift gate 2 to an output portion (charge to voltage converter). Thereby, the output portion outputs a time-serial signal representing the illuminance distribution on the photoelectric transducer portion 1. A clear gate 4 has a structure similar to that of the shift gate 2 and serves to shift the charges of the photoelectric transducer portion 1 to a drain terminal 5 and to clear it.

The signal integration type image sensing device of the configuration as described above operates in the manner as shown in FIG. 2.

Referring to FIG. 2, charges 6 and 6' are generated at the photoelectric transducer portion 1 by photovoltaic effects. The unwanted charges 6' stored in the photoelectric transducer portion 1 as shown in FIG. 2A are first discharged to the drain terminal 5 as shown in FIG. 2B by opening the clear gate 4. After completely clearing the unwanted charges as shown in FIG. 2C, the clear gate 4 is closed so that the charges 6 are accumulated in the photoelectric transducer portion 1 in correspondence with the illuminance distribution of incident light, as shown in FIG. 2D. When the shift gate 2 is opened after the elapse of a predetermined period of time, the charges 6 in the photoelectric transducer portion 1 are shifted to the transfer portion 3 through the shift gate 2 and then to the output unit in a well known manner.

Figure 2A:
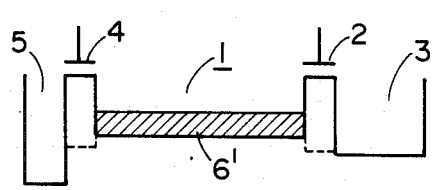
FIGS. 2A, 2B, 2C, 2D and 2E show changes in the internal potential of the conventional signal integration type image sensing device shown in FIG. 1 for explaining a conventional method for controlling the signal integration time therefor.
Figure 2B:
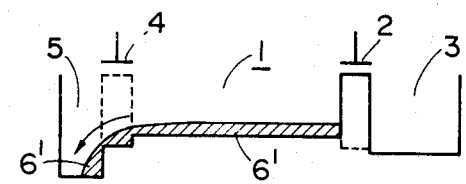
Figure 2C:
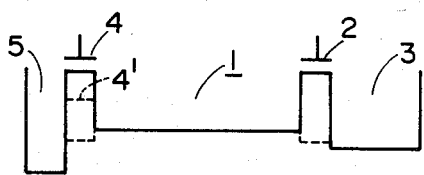
Figure 2D:
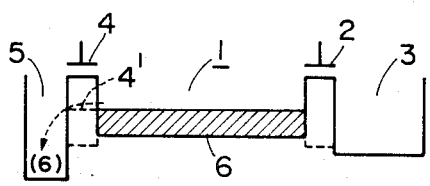
Figure 2E:
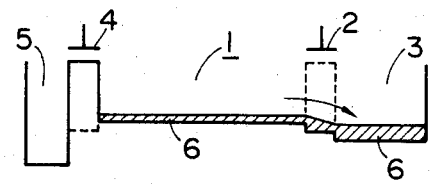

The signal integration time represents a period of time from the time when the unwanted charges 6' are completely cleared and the clear gate 4 is closed as shown in FIG. 2C to the time when the shift gate 2 is opened and the charges 6 in the photoelectric transducer portion 1 are shifted to the transfer portion 3 (more precisely, exactly when the shift of the charges 6 is completed) as shown in FIG. 2E. Conventionally, this signal integration time is controlled in a stepped manner based on the preceding output level of the image sensing device. However, with this conventional method, control must be performed so that a plurality of mutually different discrete signal integration times are preset and a suitable one is selected in each signal integration operation. Therefore, the configuration of a control circuit becomes complex. Furthermore, since the change in time is made in a stepped manner, the control is unable to follow abrupt changes in the intensity of radiation. When the intensity of incident radiation periodically changes (e.g., due to effects of artificial illumination), the output level fluctuates upon every signal integration operation even with the same signal integration time, if the scanning device is not well synchronized with the change in the intensity of incident radiation. This method is also poor in reliability since the control involved in this method is not the so-called "real time" control.

In the method disclosed in the specification and the drawings in Japanese Patent Application No. 54-17425 described above, when the clear gate 4 is closed after clearing the unwanted charges as shown in FIG. 2C, the clear gate 4 is kept at a suitable potential level 4'. During the following period of accumulating the charges in the photoelectric transducer 1, when the accumulated charge reaches the potential level 4' of the clear gate 4 and exceeds it, part of it overflows through the clear gate 4. The overflowed charge at this instant is detected outside the clear gate 4. Based on the detected overflowed charges, the timing for shifting the charge 6 from the photoelectric transducer portion 1 to the transfer portion 3, that is, for opening the shift gate 2 is determined. With this method, control of the signal integration time may be performed in "real time" and in a nonstepped manner, so that the drawbacks of the other prior art methods are eliminated. However, in the method disclosed in this specification, as may be seen from FIG. 2D, the overflow of charges 6 at least at part of the photoelectric transducer portion 1 is detected. Therefore, the readout output of the image sensing device, that is, the video signal (time-serial scanning signal) is clipped at the part corresponding to the overflow and is thus adversely affected.

The preferred embodiment of the present invention which is intended to solve this problem will now be described.

Figure 3A:
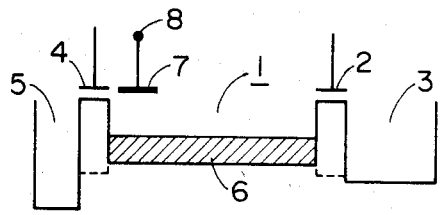
FIGS. 3A and 3B are views showing the structure of a signal integration type image sensing device suitable for a method of the present invention.
Figure 3B:
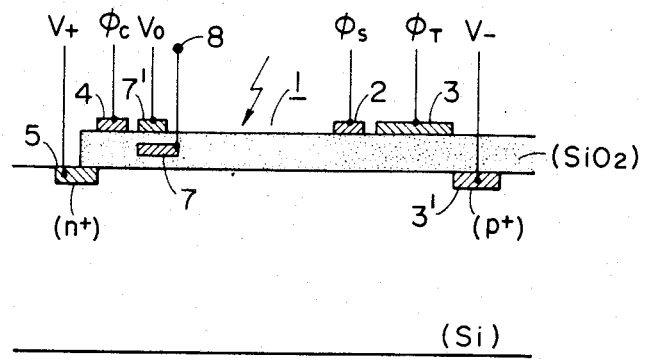

FIG. 3 shows the configuration of a one-dimensional CCD sensor which is suitable for the method of the present invention. The configuration as shown in FIG. 3 differs from the conventional CCD sensor shown in FIGS. 1 and 2 only in that a floating gate 7 is incorporated at part of the photoelectric transducer portion 1 as a means for monitoring the accumulated charge in the photoelectric transducer portion 1 non-destructively, i.e., without clipping or damage. An output terminal 8 is attached to the floating gate 7. As may be seen from FIG. 3B showing the configuration of the image sensing device in more detail, an electrode 7' is arranged above the floating gate 7 through an insulating layer of $SiO_2$. A suitable bias voltage V0 is applied to the electrode 7'. With this configuration, a signal corresponding to the accumulated charge at the part of the photoelectric transducer portion 1 at which the floating gate 7 is arranged is obtained from the output terminal 8. As shown in FIG. 3B, the substrate of the image sensing device is made of silicon, and the drain terminal 5 is an $n^+$-type region to which a suitable positive bias voltage V+ is applied. A channel stopper 3' outside the transfer portion 3 is a $p^+$-type region to which is applied a suitable negative bias voltage V−. A shift pulse $\phi S$ is used to open the shift gate 2, a transfer drive pulse $\phi T$ is supplied to the transfer portion 3 to operate it, and a clear pulse $\phi C$ is used to open the clear gate 4.

In a signal integration type image sensing device as described above, when the charges 6 in the photoelectric transducer portion 1 increase in accordance with the illuminance, the output potential of the output terminal 8 of the floating gate 7 also increases. Therefore, by detecting the changes in the output voltage from the output terminal 8 of the floating gate 7, the accumulated charges in the photoelectric transducer portion 1 may be measured. According to the method of the present invention, the signal integration time of the charges 6 in the photoelectric transducer portion 1 is controlled by a detection signal of the accumulated charge. Therefore, with the method of the present invention, the charge is detected without clipping or the like so that the output of the image sensing device may not be subjected to damage. Furthermore, since this control may be performed in "real time" and in a nonstepped manner, similar advantageous effects as obtainable with the method disclosed in Japanese Patent Application No. 54-17425 may also be obtained. Although one floating gate 7 is basically incorporated for one photoelectric transducer element, the floating gates 7 need not be incorporated for all the photoelectric transducer elements but may be incorporated for some arbitrarily selected elements.

The image sensing device for the configuration as described above operates in the manner as shown in FIG. 4.

Figure 4A:
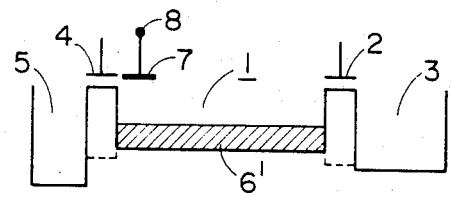
FIGS. 4A, 4B, 4C, 4D and 4E show changes in the internal potential of the signal integration type image sensing device shown in FIG. 1 for explaining an embodiment of the method of the present invention.
Figure 4B:
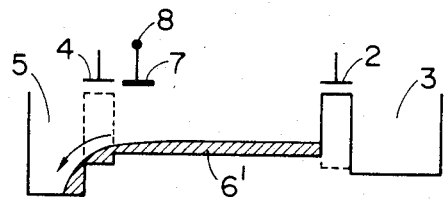
Figure 4C:
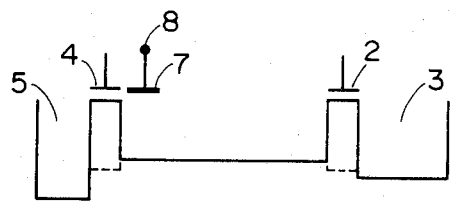
Figure 4D:
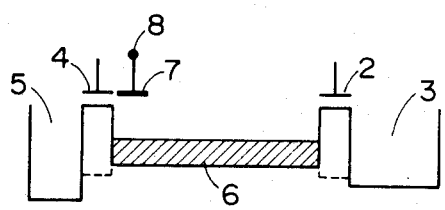
Figure 4E:
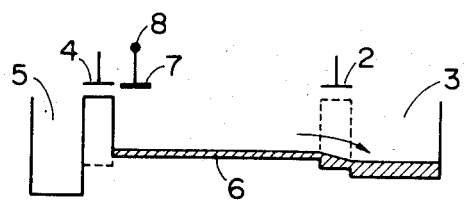

The unwanted charges 6' accumulated in the photoelectric transducer portion 1 as shown in FIG. 1A are cleared to the drain terminal 5 by opening the clear gate 4 as shown in FIG. 4B. Then, after completely clearing the unwanted charges 6' as shown in FIG. 4C, the clear gate 4 is closed to start accumulating the charges 6 in the photoelectric transducer portion 1. Then, from this moment, the accumulated charges in the photoelectric transducer portion 1 are monitored based on the output voltage from the output terminal 8 of the floating gate 7. When the accumulated charge reaches a predetermined value (FIG. 4D), the shift gate 2 is opened as shown in FIG. 4E to shift the accumulated charges in the photoelectric transducer portion 1 to the transfer portion 3. The image sensing device then produces an output, thus accomplishing control of the signal integration time.

Figure 5:
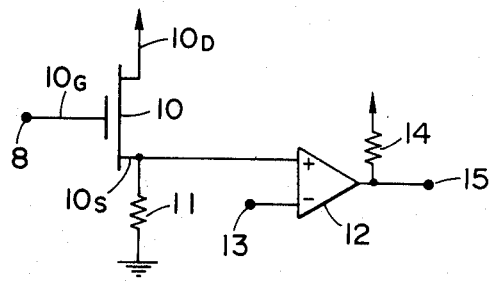
FIG. 5 is a partial circuit diagram showing an example of a signal integration type discrimination circuit which may be used with the signal integration type image sensing device shown in FIG. 3.

FIG. 5 shows an example of a signal integration discrimination circuit which converts the output voltage from the output terminal 8 of the floating gate 7 shown in FIG. 3 to a general logic signal. The output voltage from the output terminal 8 of the floating gate 7 is impedance-converted by a circuit consisting of a MOS transistor 10 and a resistor 11 connected to a source 10S of the MOS transistor 10, and is then applied to the non-inverting input end (+) of a comparator 12. The output voltage from the output terminal 8 of the floating gate 7 is applied to a gate 10G of the MOS transistor 10, to a drain 10D to which is applied a voltage. A reference voltage corresponding to the suitable accumulated charge is applied to a terminal 13 and to the inverting input end (−) of the comparator 12.

With the signal integration discrimination circuit of the configuration as described above, whether the accumulated charge is at a suitable level or not is discriminated by whether the output from an output terminal 15 of the comparator 12 is at "high" or "low" level. In the example of the circuit described above, the output from the comparator 12 remains at "low" level until the accumulated charge reaches a suitable level. The output from the comparator 12 goes from "low" level to "high" level when the accumulated charge reaches the suitable level.

Figure 6:
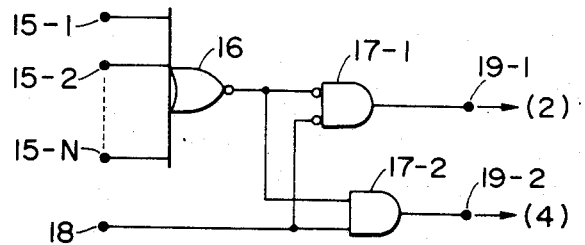
FIG. 6 is a circuit diagram showing an example of a control circuit for the signal integration type image sensing device, which may be used in combination with the circuit shown in FIG. 5.

FIG. 6 shows an example of a control circuit to automatically control the signal integration time with the signal integration discrimination circuit shown in FIG. 5.

Referring to FIG. 6, the floating gates 7 are incorporated for all of the photoelectric transducer elements of the photoelectric transducer portion 1 numbering N. Therefore, N discrimination circuits are also incorporated in correspondence with the respective photoelectric transducer elements shown in FIG. 5. Output terminals 15-1 to 15-N of the discrimination circuits correspond to the respective photoelectric transducer elements. A signal at a terminal 18 goes from "high" to "low" level, when the charges are to be accumulated in the photoelectric transducer portion 1. With the control circuit of the configuration as shown in FIG. 6, when the accumulated charge of at least one of the photoelectric transducer elements reaches the suitable level, the output from a NOR gate 16 goes "low" level. Since the terminal 18 is at "low" level at this point, an output terminal 19-1 of a NAND gate 17-1 goes "high" level. When the terminal 18 is at "high" level, the output of the NOR gate 16 is necessarily at "high" level and accordingly an output terminal 19-2 of a gate 17-2 is at "high" level. The outputs from the output terminals 19-1 and 19-2 are converted to voltages which are applied to the shift gate 2 and the clear gate 4 shown in FIG. 3. In this manner, the signal integration time is automatically controlled in correspondence with the illuminance of incident light.

The charge accumulated in the photoelectric transducer element at which the illuminance is highest in the illuminance distribution on the photoelectric transducer elements may thus be controlled to a suitable level in this manner.

The MOS transistor 10, the comparator 12, the gates 16, 17-1 and 17-2, and the resistors 11 and 14 shown in FIGS. 5 and 6 may be mounted on a single chip together with the image sensing device. It is also possible to use a charge detection mechanism other than the floating gate structure. In the example shown in FIG. 6, the floating gates are incorporated for all the photoelectric transducer elements. However, the floating gates may be incorporated for an arbitrarily selected number of photoelectric transducer elements and at least one floating gate only need be incorporated to fulfill the purpose of the present invention.

What we claim is:

1. An image sensing system comprising: p1 an image sensing device including:
- a plurality of radiation-sensitive elements, each of which generates a signal corresponding to incident radiation and stores and integrates the respective generated signal;
- readout means for reading out the integrated signals from said radiation-sensitive elements;
- a plurality of separate detecting means for detecting the respective amounts of the integrated signals at respective ones of said radiation-sensitive elements, each of said detecting means producing an indication of the respective detected amount; and
- clear means for clearing the signals from each of said radiation-sensitive elements; and control means for controlling said readout means based on a maximum indication from among the indications produced by said detecting means, wherein each of said detecting means is associated with at least a part of one of said radiation-sensitive elements, respectively, and wherein each of said detecting means includes a floating gate.

2. A system according to claim 1, wherein the number of said detecting means is fewer than the total number of said radiation-sensitive elements.

3. A system according to claim 2, wherein said control means is arranged to cause said readout means to read out the integrated signals from said radiation-sensitive elements when said maximum indication detected by said detecting means reaches a predetermined threshold.

4. A system according to claim 1, wherein said detecting means are arranged to detect changes in the integrated signals of all of said radiation-sensitive elements.

5. A system according to claim 4, wherein said control means is arranged to cause said readout means to read out the integrated signals from said radiation-sensitive elements when said maximum indication detected by said detecting means reaches a predetermined threshold.

* * * * *